United States Patent [19]
Liang et al.

[11] Patent Number: 5,716,881
[45] Date of Patent: Feb. 10, 1998

[54] PROCESS TO FABRICATE STACKED CAPACITOR DRAM AND LOW POWER THIN FILM TRANSISTOR SRAM DEVICES ON A SINGLE SEMICONDUCTOR CHIP

[75] Inventors: Mong-Song Liang, Hsin-Chu; Shou-Gwo Wuu, Chu-Tong; Chen-Jong Wang; Chung-Hui Su, both of Hsin-Chu, all of Taiwan

[73] Assignee: Taiwan Semiconductor Manufacturing Company, Ltd., Hsin-Chu, Taiwan

[21] Appl. No.: 623,243

[22] Filed: Mar. 28, 1996

[51] Int. Cl.$^6$ .................................. H01L 21/8242
[52] U.S. Cl. .................... 438/238; 438/239; 438/253
[58] Field of Search ..................... 438/238, 241, 438/244, 253, 383, 382, 396, 239

[56] References Cited

U.S. PATENT DOCUMENTS

| | | |
|---|---|---|
| 5,066,602 | 11/1991 | Takemoto et al. ............... 437/31 |
| 5,187,122 | 2/1993 | Bonis ............................... 438/648 |
| 5,340,762 | 8/1994 | Vora ................................. 437/52 |
| 5,389,568 | 2/1995 | Yun .................................. 438/253 |
| 5,525,552 | 6/1996 | Huang .............................. 438/238 |

*Primary Examiner*—Jey Tsai
*Attorney, Agent, or Firm*—George O. Saile; Stephen B. Ackerman

[57] ABSTRACT

A fabrication process for integrating stacked capacitor, DRAM devices, and thin film transistor, SRAM devices, has been developed. The fabrication process features combining key operations used to create transfer gate transistor structures, and access transistor structures for the DRAM and SRAM devices. In addition, process steps, used to create a capacitor structure, for the DRAM device, and a thin film transistor structure, for the SRAM device, are also shared. Another key feature of this invention is a buried contact structure, used for the SRAM device.

26 Claims, 17 Drawing Sheets

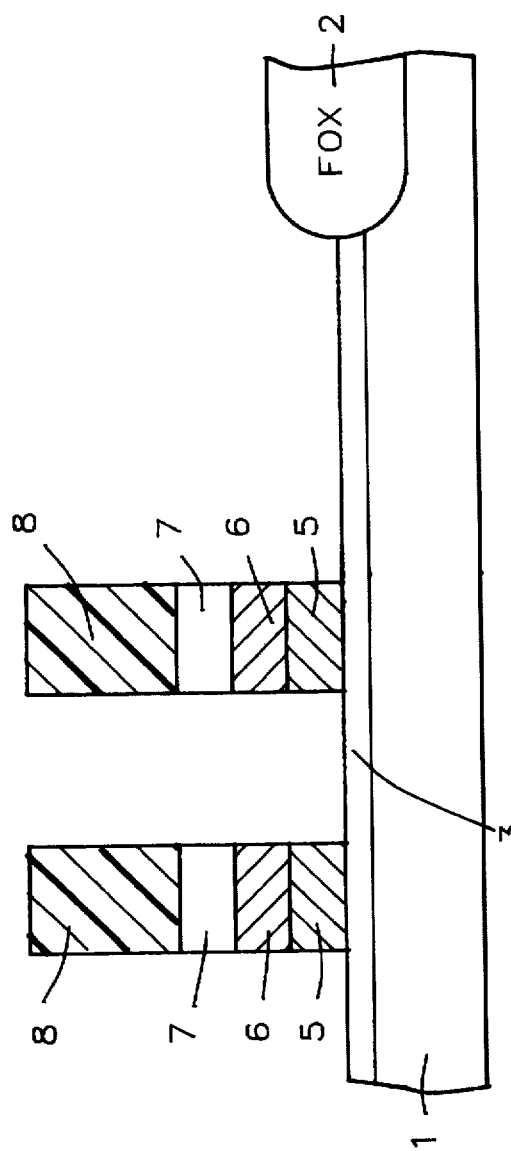
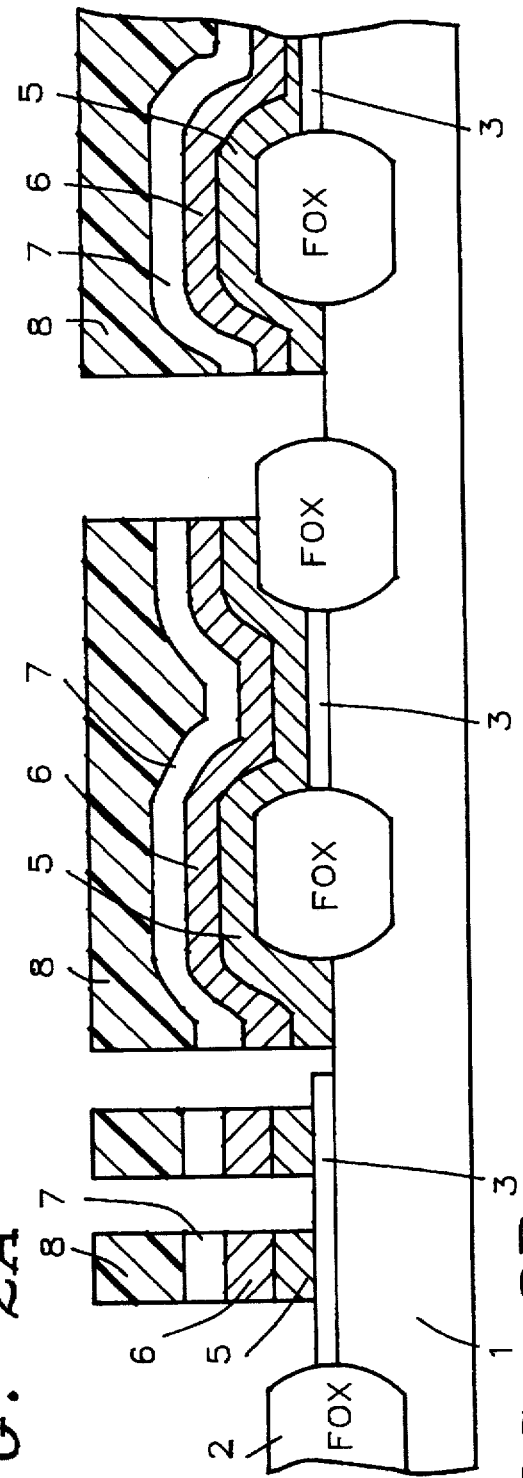
FIG. 2A
FIG. 2B

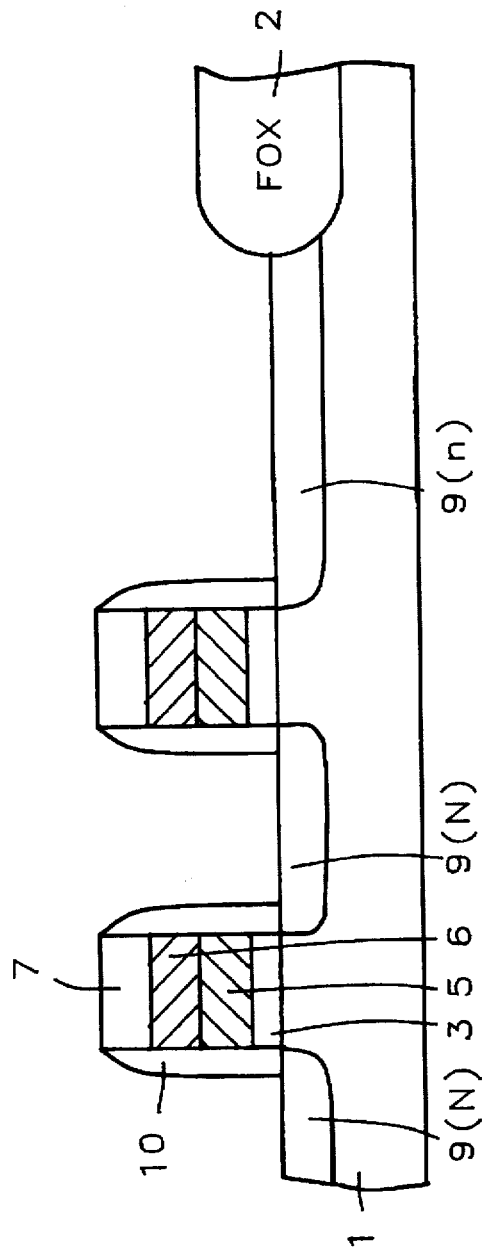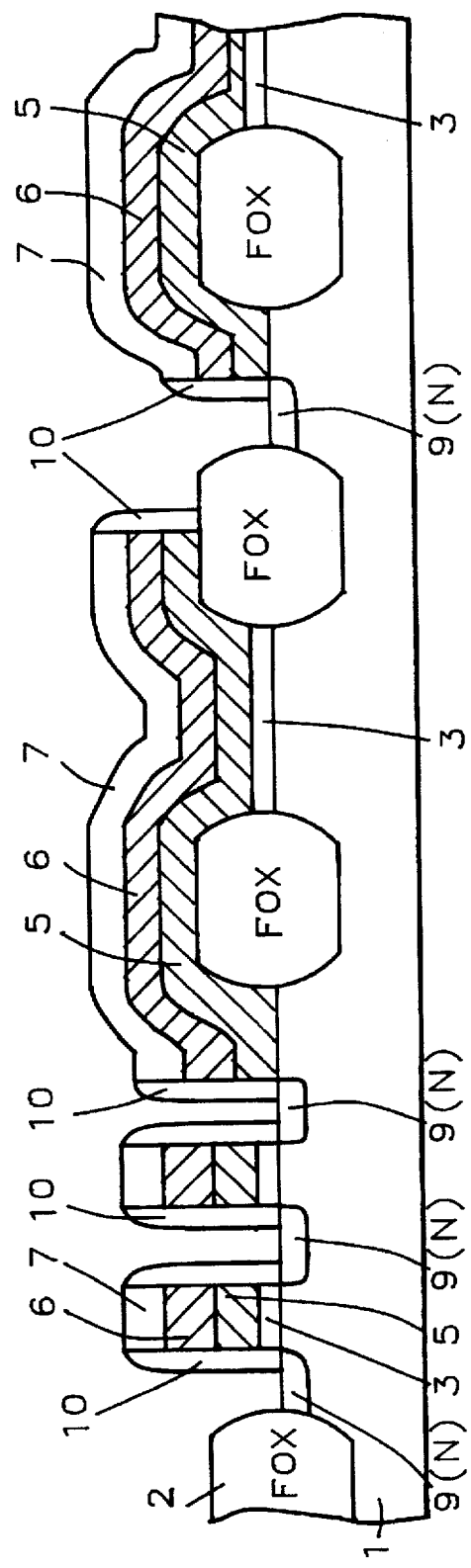
FIG. 3A
FIG. 3B

PROCESS TO FABRICATE STACKED CAPACITOR DRAM AND LOW POWER THIN FILM TRANSISTOR SRAM DEVICES ON A SINGLE SEMICONDUCTOR CHIP

BACKGROUND OF THE INVENTION (1) Field of the Invention

This present invention relates to the fabrication of semiconductor devices, and more specifically to fabrication processes used to integrate memory and logic devices on the same semiconductor chip.

(2) Description of Prior Art

Two basic types of devices, manufactured by the semiconductor industry, are logic and memory. Logic devices are used to process information or data, while memory device are used for storage of information or data. These two types of devices are found in all computers, however each is manufactured on a specific chip, used either for logic or memory. In the past it had been difficult to blend, or integrate both types of devices on a single semiconductor chip. Semiconductor fabrication processes used for each specific device type had unique features, and thus unique process steps. This forced the semiconductor process community to use a complex, lengthy and costly process sequence, in an attempt to integrate both logic and memory devices on a single semiconductor chip.

If a less difficult process for integrating the two types of devices can not be realized, the consequence will be ultimately be observed in system performance and cost. In systems where logic and memory functions are packaged separately, data signals between the two may have to pass through several levels of wiring, boards, pins, etc., all of which result in undesirable propagation delays. In addition to the performance degradation, resulting from separating logic and memory applications, at the semiconductor chip level, the cost of having to fabricate silicon wafers, with a unique fabrication process, directed at the logic device, and to then fabricate additional wafers, again with unique processing, directed at the memory device, is significantly greater then the cost of producing both devices, on the same silicon wafer. Therefore efforts for integrating, or blending memory and logic devices on the same semiconductor chip have been increasing. One example of blending technologies is the formation of both bipolar and complimentary metal oxide semiconductor, (CMOS), device structures on the same chip, disclosed by Takemoto, et al, in U.S. Pat. No. 5,066,602, and by Vora, et al, in U.S. Pat. No. 5,340,762. However a process for blending memory devices, and CMOS logic devices is not discussed. This invention will describe a novel, semiconductor process sequence, used to integrate stacked capacitor, dynamic random access memory, (DRAM), memory devices, with thin film transistor, (TFT), static random access memory, (SRAM), devices, used for logic applications.

SUMMARY OF THE INVENTION

It is an object of this invention to provide a semiconductor fabrication process for forming memory and logic devices on the same semiconductor chip.

It is another object of this invention to fabricate a stacked capacitor, DRAM device, and a thin film transistor, SRAM device, using identical processing steps to produce the stacked capacitor portion, of the DRAM device, and the thin film transistor portion, of the SRAM device.

It is yet another object of this invention to fabricate a stacked capacitor, DRAM device, and a thin film transistor, SRAM device, using identical processing steps to produce the transfer gate transistor portion, of the DRAM device, and the access transistor portion, of the SRAM device.

In accordance with the present invention a process is described allowing DRAM and SRAM devices to be formed on a single semiconductor chip, using a integrated process sequence. After field oxide formation, for purposes of device isolation, the transfer gate transistor, of the DRAM device, and the access transistor, of the SRAM device, are simultaneously formed via growing a thermal gate oxide, depositing and doping a first polysilicon layer, depositing a silicide layer, and depositing an insulator layer. Photolithographic, and reactive ion etching procedures produce a first polycide, (silicide-polysilicon), gate structure, for the transfer gate transistor, of the DRAM device, and for the access transistor, of the SRAM device. The identical first polycide gate structure is also produced for a buried contact structure, of the SRAM device, with a portion of the first polycide gate structure contacting the underlying semiconductor substrate. Ion implantation processes are used to produce lightly doped source and regions, between the first polycide gate structures, of the DRAM and SRAM devices. Insulator sidewall spacers are created, on the sides of the first polycide gate structures, by depositing an insulator, and using an anisotropic, reactive ion etching process to remove the insulator from all areas except from the sides of the first polycide gate structures. Another ion implantation process is employed to create heavily doped source and drain regions, between the insulator sidewalled, first polycide gate structures. Another layer of insulator is deposited, followed by photolithographic and reactive ion etching, used to open a region in the insulator, between the first polycide gate structures of the DRAM device, and between first polycide gate structures of the SRAM device, again exposing the semiconductor substrate. A second polysilicon layer is deposited, doped, and followed by the deposition of another silicide layer. Photolithographic and reactive ion etching procedures are used to create an overlying, second polycide gate structure, self aligned to, and contacting the underlying semiconductor substrate, in areas between the DRAM, transfer gate transistor, and for the SRAM, access transistor. Another insulator is deposited and planarized via chemical mechanical polishing procedures. First contact holes are opened in the planarized insulator layer, to expose the first polycide gate structure, used for the buried contact structure, of the SRAM device. A third polysilicon deposition, completely filling the first contact holes, is performed, with the unwanted third polysilicon layer, on the field, removed via reactive ion etching procedures, forming a polysilicon plug in the first contact holes. High temperatures, experienced during previous, and subsequent processing procedures, will result in out diffusion of dopants from the second polycide gate structure, reaching the underlying semiconductor regions, interfacing the overlying second polycide gate structure, thus resulting in the creation of a buried contact structure. A second contact hole is opened, in the planarized insulator layer, to expose a heavily doped source and drain region of the DRAM device. A fourth polysilicon layer, used as a bottom capacitor electrode, is deposited and patterned to form a polysilicon capacitor electrode, on the sidewalls of the second contact hole, and planar polysilicon capacitor electrodes, overlying the polysilicon filled, first contact holes, of the SRAM device. A thin capacitor dielectric layer is next blanket deposited, and patterned to open holes in the capacitor dielectric, exposing the underlying planar polysilicon capacitor electrode, of the SRAM device. A fifth polysilicon layer, to be used as a top capacitor electrode, is deposited, and patterned to form a capacitor structure, in the second contact hole of the DRAM device, and patterned to form a planar capacitor structure, the thin film transistor, on the buried contact structure, of the SRAM device. Another insulator layer is deposited, and via holes opened to expose the top surface of the capacitor structure, in the second contact hole, and the top surface of the second polycide structure, of the DRAM device, while also exposing the top surface of the thin film transistor structure, and the top surface of the second polycide structure, of the SRAM device. Tungsten deposition, followed by removal of unwanted tungsten, result in tungsten plugs, in the via holes. Metallization, and patterning, result in metal contact structures, overlying the tungsten filled via holes.

BRIEF DESCRIPTION OF THE DRAWINGS

The object and other advantages of this invention are best described in the preferred embodiment with reference to the attached drawings that include:

FIGS. 1A, 2A, 3A, 4A, 5A, 6A, 7A, 8A, 9A, 10A, which schematically, in cross-sectional style, illustrate the fabrication stages used to create the stacked capacitor, DRAM device structure.

FIGS. 1B, 2B, 3B, 4B, 5B, 6B, 7B, 8B, 9B, 10B, which schematically, in cross-sectional style, illustrate the stages of fabrication used to create the thin film transistor, SRAM device structure.

DESCRIPTION OF THE PREFERRED EMBODIMENTS

The method of integrating stacked capacitor, DRAM device structures, and thin film transistor, SRAM device structures, on a single semiconductor chip, will now be covered in detail. This invention will describe a N type DRAM device, although a P type DRAM device can be easily substituted by creating an N well region, and using P type dopants for source and drain regions. In addition for the SRAM device, only an N channel transistor will be detailed. However for SRAM designs incorporating both N and P channel devices, the addition of the P channel device can easily be accomplished via the creation of an N well region, and routine photolithographic masking of non-P channel regions, followed by P type source and drain formation.

Figure 1A:
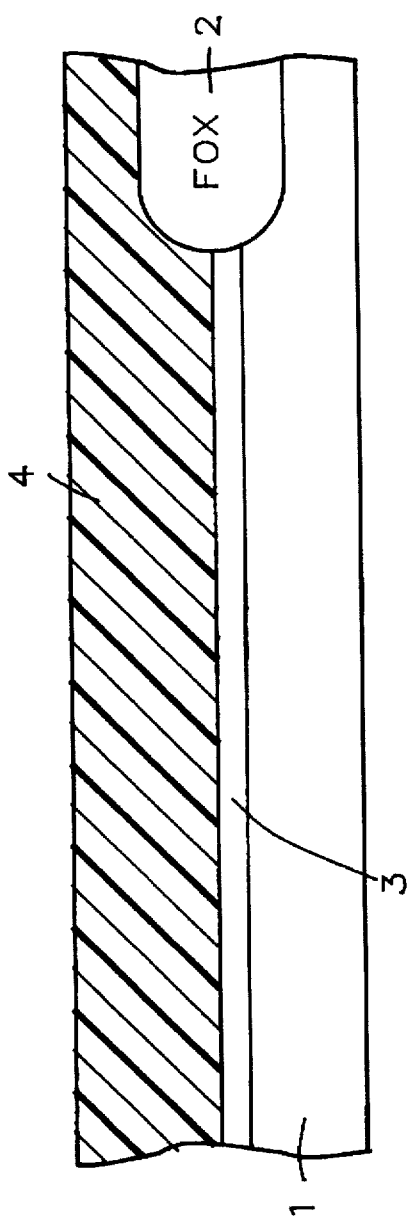
Figure 1B:
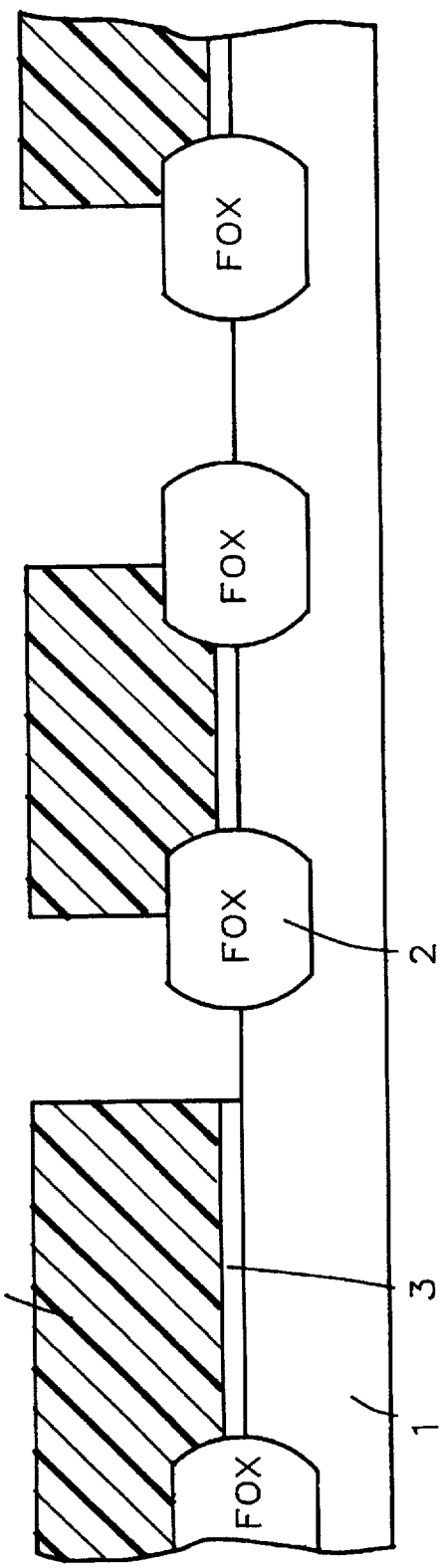

A P type, semiconductor substrate, 1, composed of single crystalline silicon, with a <100> crystallographic orientation, is used for both the stacked capacitor DRAM device structure, shown in FIG. 1a, as well as for the thin film transistor, SRAM, (TFT-SRAM), device structure, shown in FIG. 1b. Thick field oxide regions, 2, (FOX), are created for both DRAM and SRAM structures, via the use of a patterned, composite oxidation mask of silicon nitride, on silicon oxide, allowing the formation of FOX, 2, only in unmasked regions. Growth of FOX region, 2, is accomplished via thermal oxidation, in an oxygen steam ambient, at a temperature between about 850° to 1050° C., producing a silicon dioxide, FOX, thickness between about 3000 to 6000 Angstroms. After removal of the composite oxidation masking layers, via use of a hot phosphoric acid solution for the silicon nitride layer, and a buffered hydrofluoric acid solution for the underlying silicon oxide layer, a gate insulator of silicon dioxide, 3, is thermally grown, in non-FOX regions, using an oxygen-steam ambient, at a temperature between about 800° to 1000° C., to produce silicon dioxide, gate insulator, 3, at a thickness between about 60 to 200 Angstroms. This is shown for both the DRAM device structure, in FIG. 1a, and the SRAM device structure, shown schematically in FIG. 1b. A photolithographic masking layer, 4, is used as a mask to allow removal of gate insulator, silicon dioxide, 3, in regions of the SRAM device structure, that will be used for a subsequent buried contact region. Gate insulator, silicon dioxide, 3, is removed via use of a buffered hydrofluoric acid solution. This is shown schematically in FIG. 1b. Photoresist removal is performed using plasma oxygen ashing, and careful wet cleans.

FIG. 2a, and FIG. 2b, show the creation of a first polycide gate structure. A first layer of polysilicon, 5, is deposited using low pressure chemical vapor deposition, (LPCVD), processing, at a temperature between about 480° to 620° C., to a thickness between about 500 to 1500 Angstroms. The polysilicon can be grown intrinsically and doped via ion implantation of arsenic or phosphorous, at an energy between about 30 to 80 KeV, at a dose between about 5E13 to 5E15 atoms/cm$^2$. The polysilicon layer, 5, can also be deposited using insitu doping procedures, by incorporating either arsine, or phosphine, into the silane flow. A first layer of tungsten silicide, 6, is next deposited, again via use of LPCVD procedures, at a temperature between about 420° to 600° C., to a thickness between about 1000 to 2000 Angstroms, using tungsten hexafluoride and silane as reactants. Finally a first insulator layer of silicon oxide, 7, is deposited using LPCVD or plasma enhanced chemical vapor deposition, (PECVD), procedures, at a temperature between about 400° to 800° C., to a thickness between about 700 to 3000 Angstroms, using tetraethylorthosilicate, (TEOS), as a source. Photolithographic and reactive ion etching, (RIE), procedures, using photoresist mask, 8, and using CHF$_3$ as an etchant for silicon oxide layer, 7, and Cl$_2$ as an etchant for both tungsten silicide layer, 6, and polysilicon layer, 5, are used to produce the first polycide gate structures shown in FIG. 2a, and in FIG. 2b. The first polycide gate structures shown in FIG. 2a, will be used as transfer gates for the subsequent DRAM devices, while FIG. 2b, shows the first polycide gate structures, on gate insulator, 3, to be used for the access transistor of the SRAM device structure, and also the first polycide gate structures, interfacing semiconductor substrate, 1, to be used for the buried contact structure of the SRAM device structure. Photoresist mask, 8, is removed via plasma oxygen ashing, and careful wet cleans.

An ion implantation of phosphorous, at an energy between about 25 to 60 KeV, at a dose between about 5E12 to 5E13 atoms/cm$^2$, is used to produce lightly doped source and drain regions, 9, for the transfer gate transistors, for the DRAM device structure, shown in FIG. 3a, and for the access transistors of the SRAM device structure, shown in FIG. 3b. This implantation process also dopes the semiconductor substrate regions, not covered by first polycide gate structures, thus allowing for a conductive area for subsequent linkup to a subsequent buried contact structure for the SRAM device structure, and a doped area for subsequent link up of a subsequent stacked capacitor structure for the DRAM device structure. A second insulator layer of silicon oxide, is next deposited using LPCVD or PECVD procedures, at a temperature between about 400° to 800° C., to a thickness between about 700 to 3000 Angstroms, using TEOS as a source. Anisotropic, RIE procedures are next employed to create insulator sidewall spacer, 10, shown schematically for the DRAM device structure, in FIG. 3a, and for the SRAM device structure, in FIG. 3b.

Figure 4A:
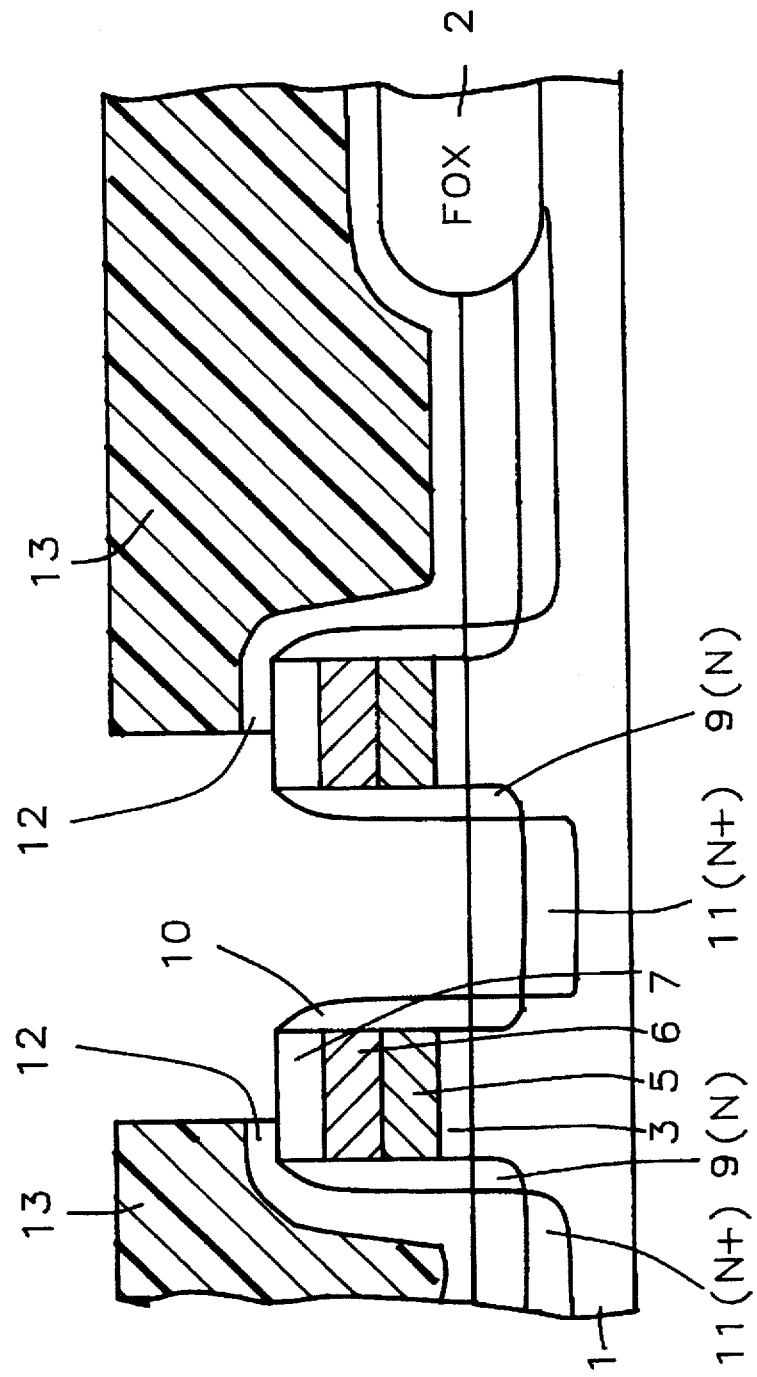
Figure 4B:
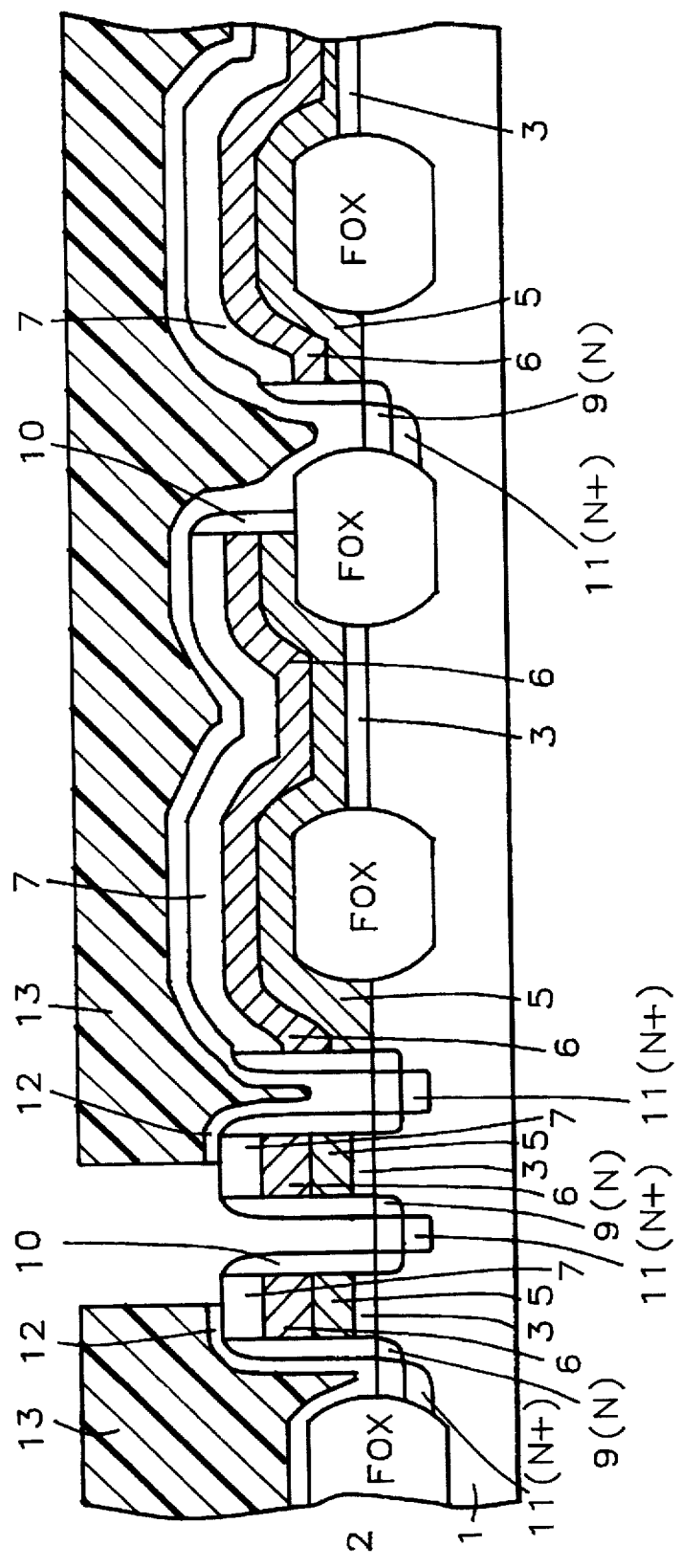

Another ion implantation procedure, using arsenic, is performed at an energy between about 35 to 100 KeV, at a dose between about 5E13 to 5E15 atoms/cm$^2$, and used to create heavily doped source and drain regions, 11, for the transfer gate transistors of the DRAM device structure, shown in FIG. 4a, and for the access transistors of the SRAM device structure shown in FIG. 4b. This implantation also increases the conductivity of the semiconductor substrate in the region which will be used for contact to a subsequent capacitor structure for the DRAM device structure, and for an area used to link up regions used for both devices. A third insulator layer of silicon oxide, 12, is deposited, again via use of either LPCVD or PECVD procedures, at a temperature between about 400° to 800° C., to a thickness between about 700 to 3000 Angstroms, using TEOS as a source. Photolithographic procedures are used to form photoresist mask, 13, which in turn is used as a mask to allow removal of silicon oxide layer, 12, via the use of RIE procedures, using $CHF_3$ as an etchant. The removal of silicon oxide layer, 12, from the surface of semiconductor substrate, 1, between transfer gate transistors of the DRAM device structure, shown in FIG. 4a, and from the surface of semiconductor substrate, 1, from between access transistors of the SRAM device structure, shown in FIG. 4b, will allow subsequent contact to semiconductor substrate, 1, to be easily formed. Photoresist mask, 13, is removed using plasma oxygen ashing, followed by careful wet cleans.

Figure 5A:
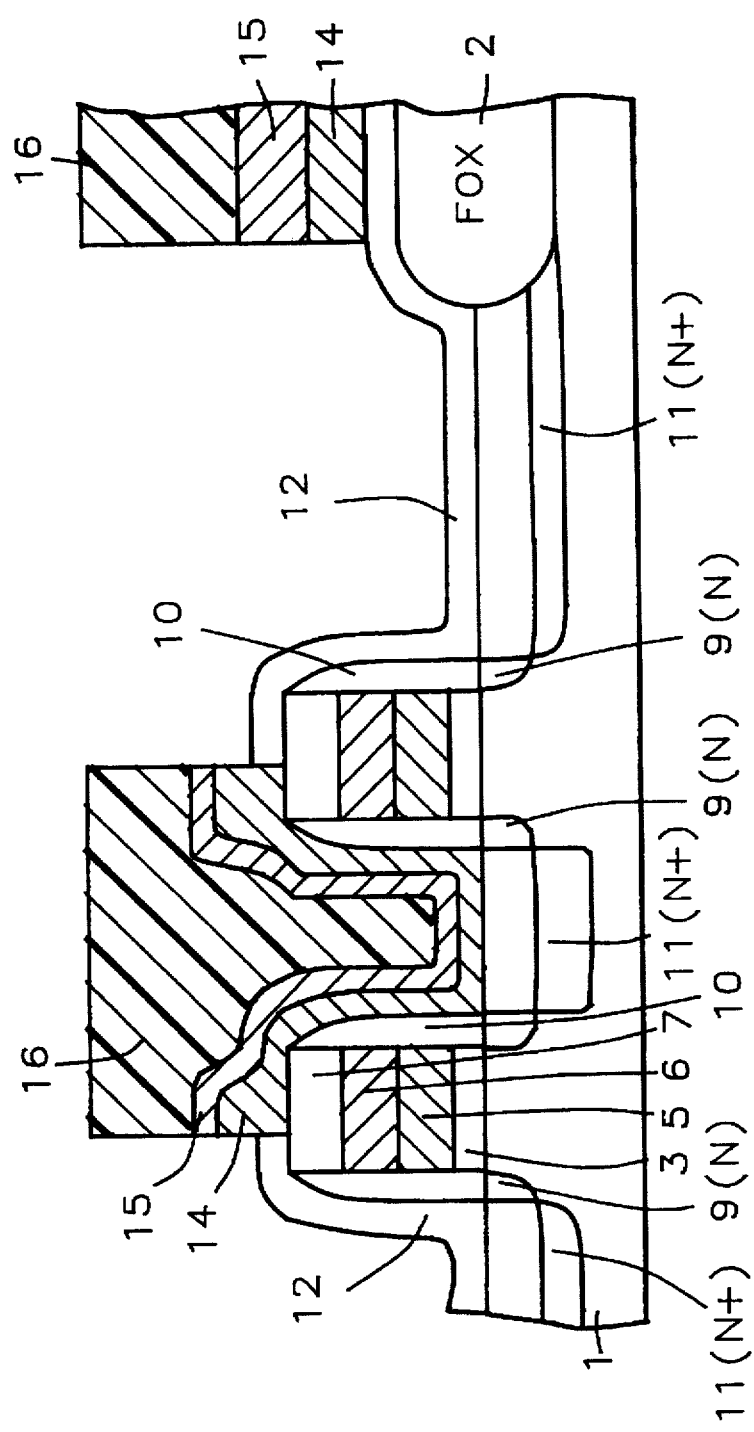
Figure 5B:
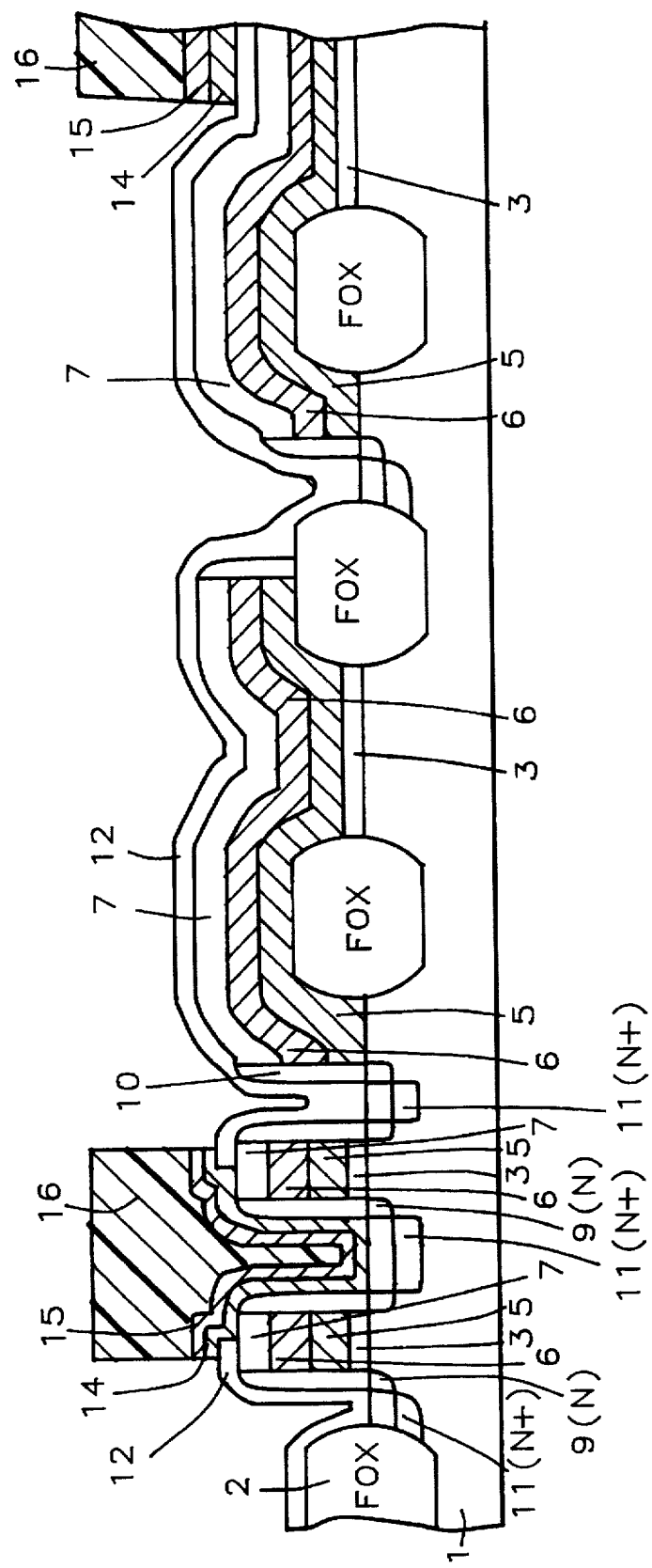

FIG. 5a, and FIG. 5b, show the creation of a second polycide gate structure, self-aligned to, and contacting, semiconductor substrate, 1, between transfer gate transistors of the DRAM device structure, (FIG. 5a), and between access transistors of the SRAM device structure, (FIG. 5b). A second layer of polysilicon, 14, is deposited using LPCVD procedures, at a temperature between about 480° to 620° C., to a thickness between about 500 to 1500 Angstroms. The polysilicon layer is again doped via an ion implantation procedure using either arsenic or phosphorous, at an energy between about 30 to 80 KeV, at a dose between about 5E13 to 5E15 atoms/$cm^2$. The polysilicon layer can also be deposited using insitu doped procedures by incorporation of either arsine or phosphine into the silane ambient. A second tungsten silicide layer, 15, is next deposited, again using LPCVD processing, at a temperature between about 420° to 600° C., to a thickness between about 1000 to 2000 Angstroms. Photoresist mask, 16, is used to allow the formation of the second polycide gate structure to occur, via the use of RIE procedures, using $Cl_2$ as an etchant. In addition to the self-aligned, second polycide gate structures, dummy structures of tungsten silicide, 15, on polysilicon, 14, are also created on the FOX region, 2, of the DRAM device structure, shown schematically in FIG. 5a, and on the buried contact structure of the SRAM device structure, shown schematically in FIG. 5b. Plasma oxygen ashing, and careful wet cleans, are used to remove photoresist mask, 16.

Figure 6A:
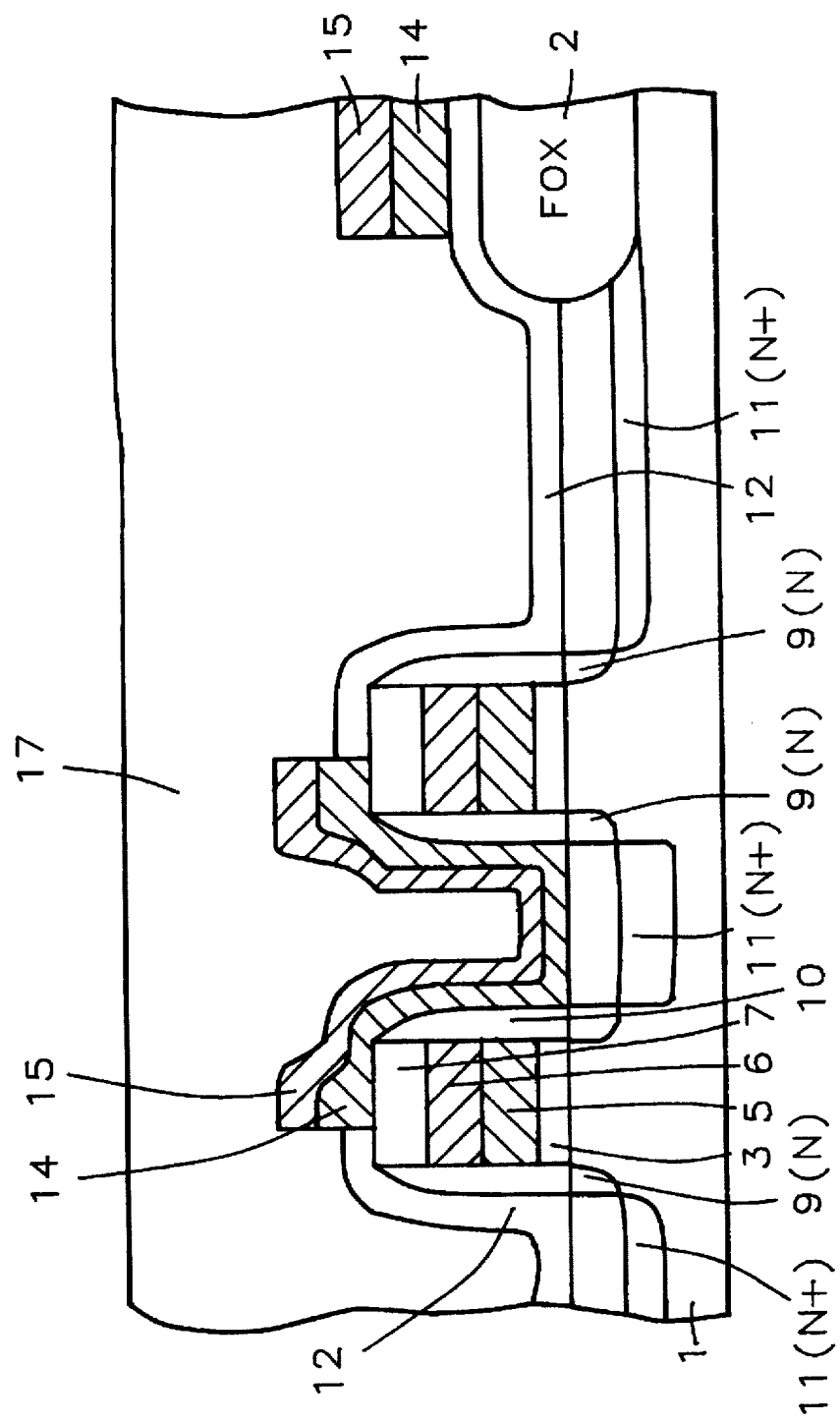
Figure 6B:
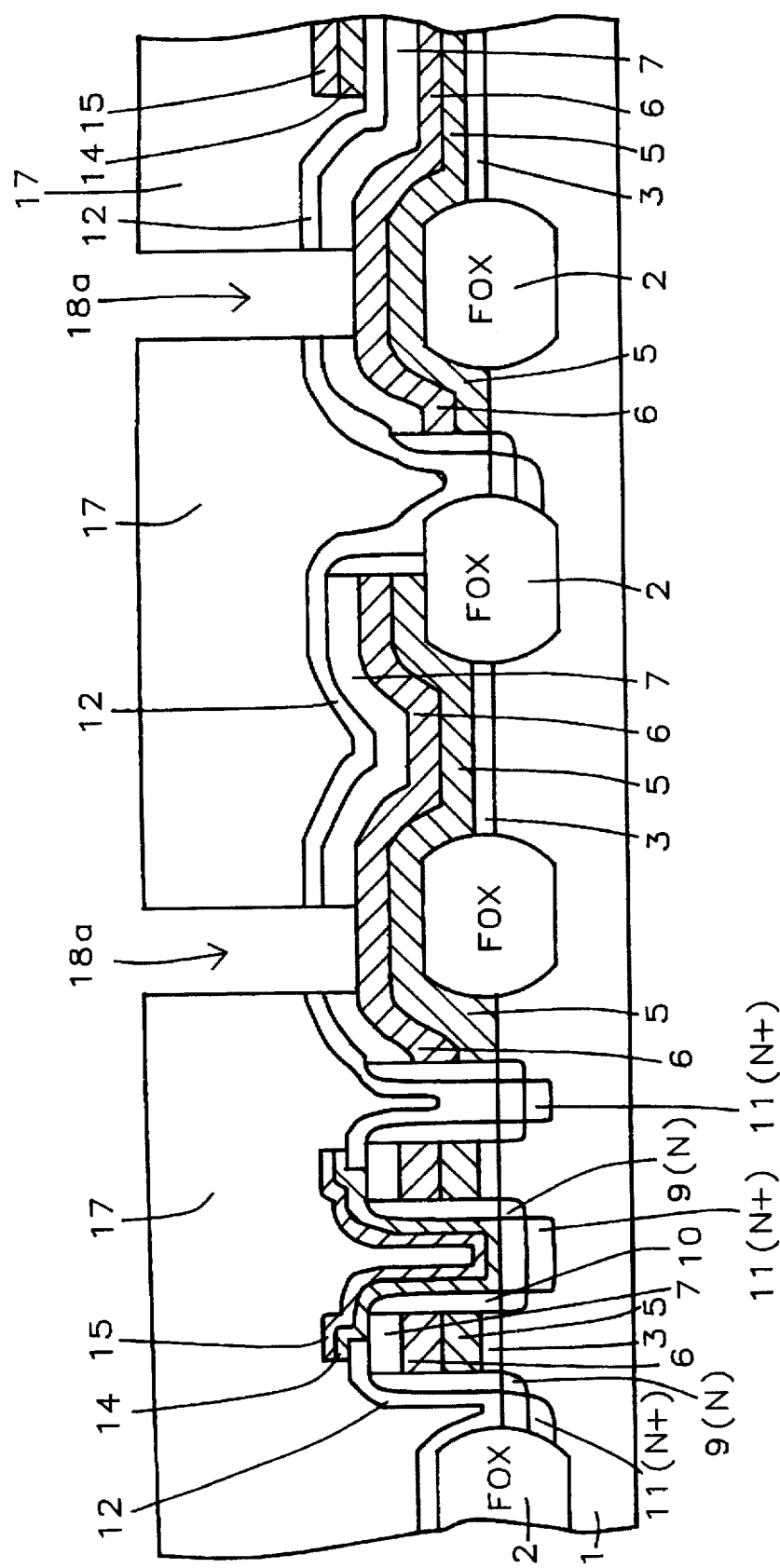
Figure 7A:
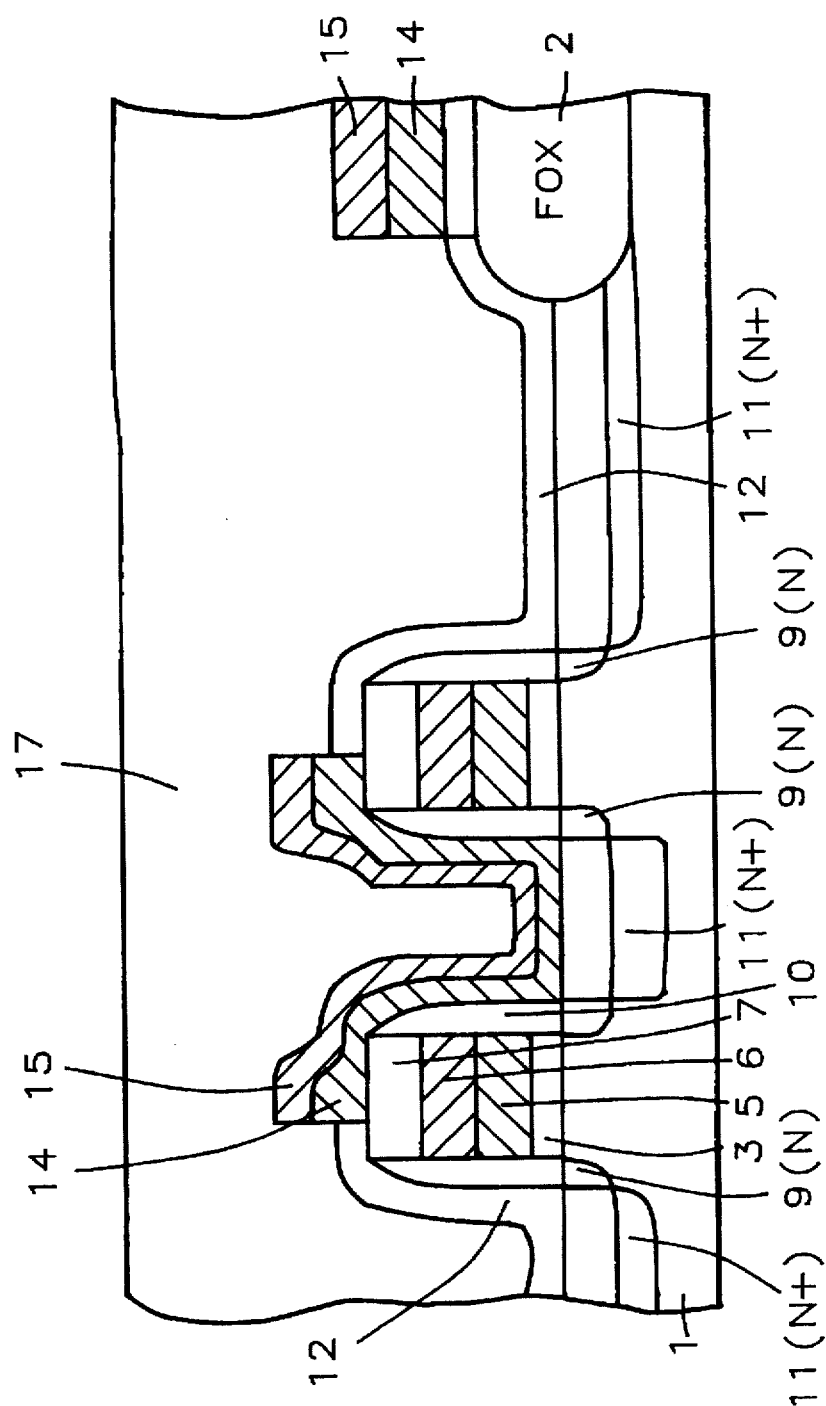
Figure 7B:
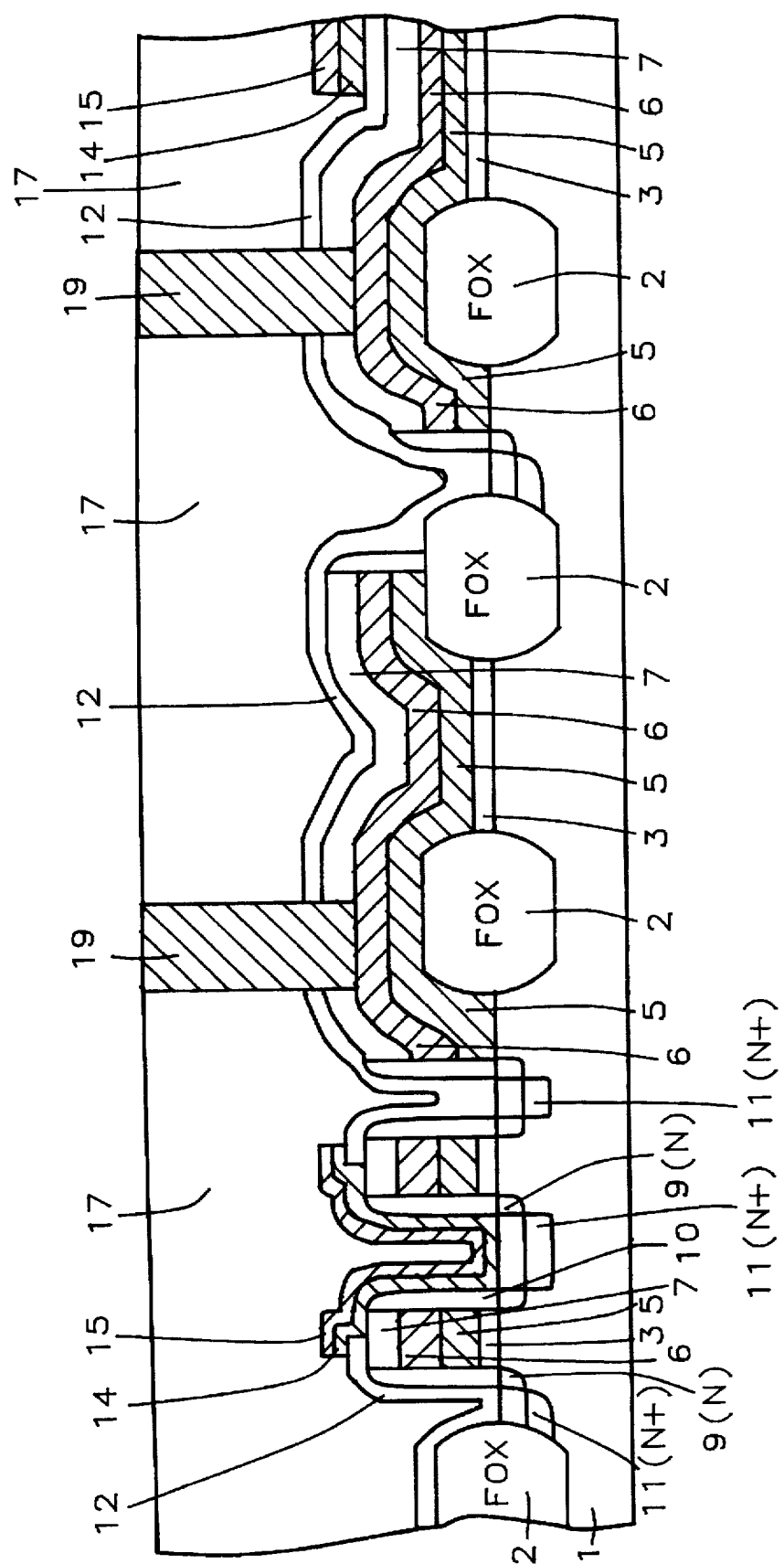

A fourth insulator layer of silicon oxide, 17, is deposited using LPCVD or PECVD processes, at a temperature between about 400° to 800° C., to a thickness between about 10000 to 25000 Angstroms. Silicon oxide layer, 17, is next subjected to a chemical mechanical polishing procedure, to create a planar topography, resulting in the thickness of polished, silicon oxide layer, of between about 5000 to 10000 Angstroms. This is shown schematically in FIGS. 6a, and 6b. A photoresist pattern, not shown, is used as a mask to allow contact holes, 18a, to be opened in planarized silicon oxide layer, 17, silicon oxide layer, 12, and silicon oxide layer, 7, exposing the top surface of the first polycide gate structure, used for subsequent substrate contact for the buried contact structure of the SRAM device structure. Contact hole 18a, shown schematically in FIG. 6b, was opened using RIE procedures, with $CHF_3$ used as an etchant. Photoresist removal is again accomplished via plasma oxygen ashing, and careful wet cleans. A third layer of polysilicon is next deposited, using LPCVD procedures, at a temperature between about 480° to 620° C., to a thickness between about 5000 to 10000 Angstroms, adding either phosphine or arsine to the ambient for insitu doping purposes, and completely filling contact holes, 18a. Polysilicon is next cleared from unwanted regions by use of either chemical mechanical polishing procedures, or via use of RIE, using $Cl_2$ as an etchant. This procedure results in the creation of polysilicon plug, 19, in contact holes, 18a, of the SRAM device structure, shown schematically in FIG. 7b.

Figure 8A:
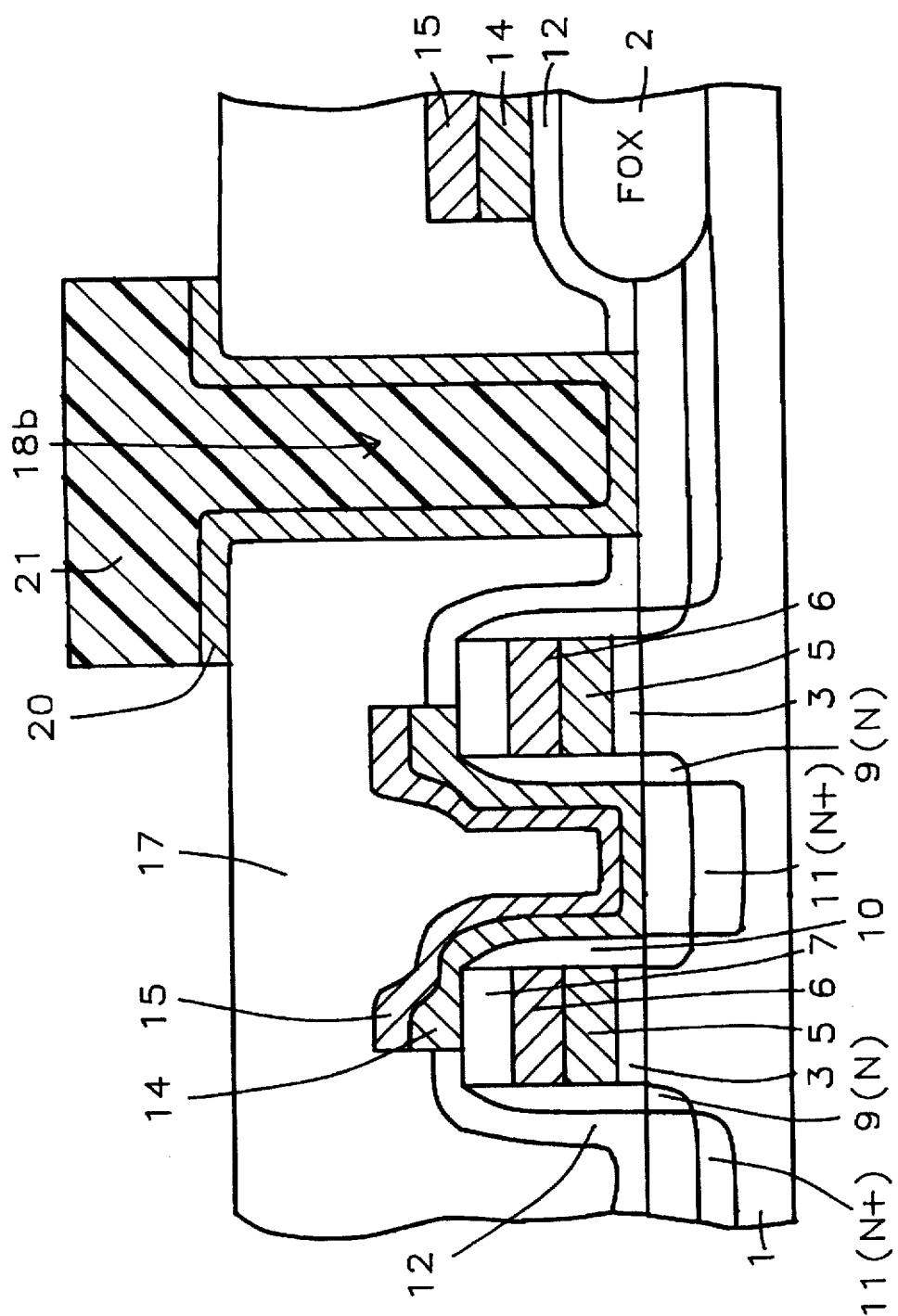
Figure 8B:
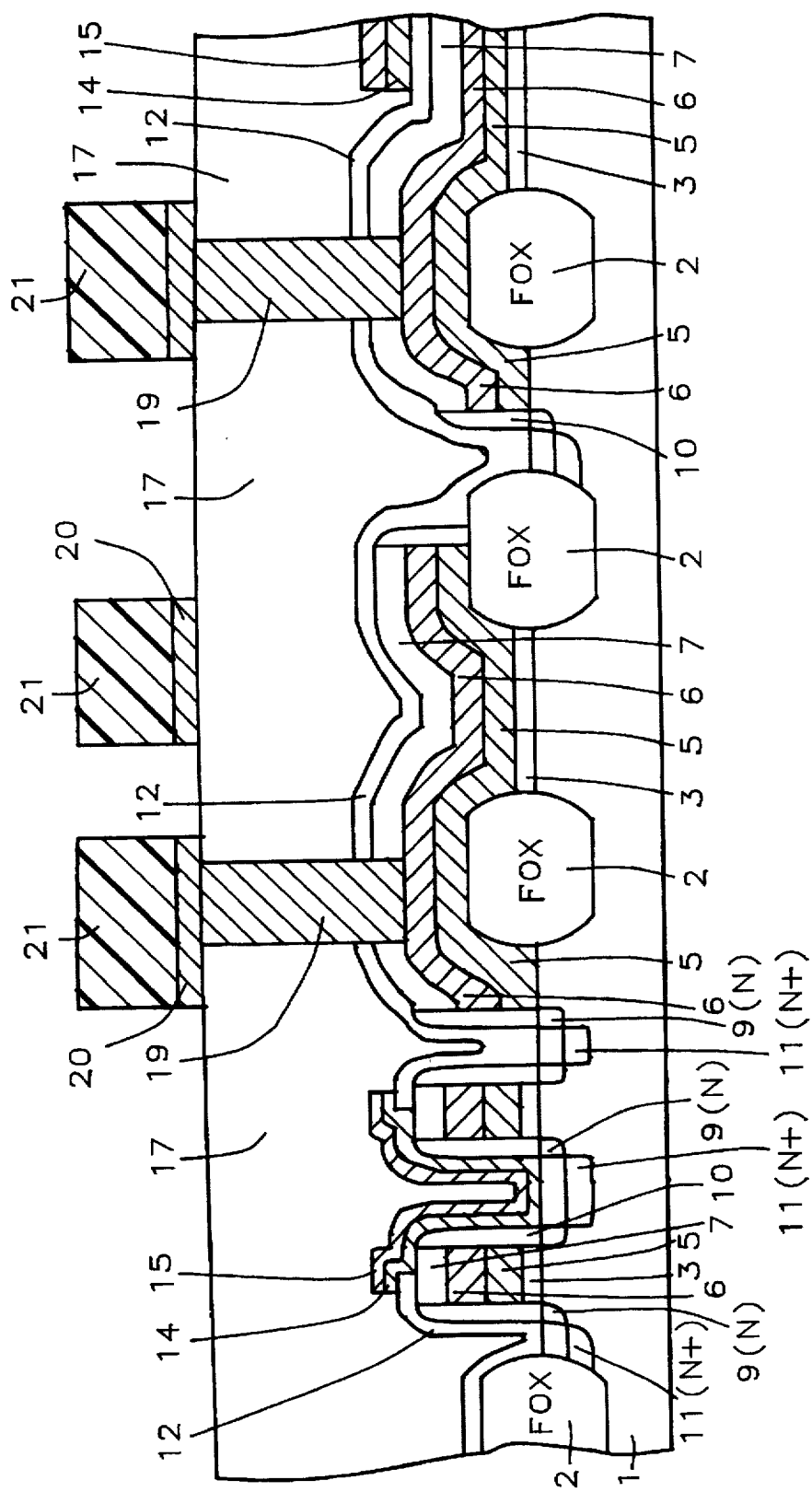

A contact hole, 18b, is next formed for the DRAM device structure, and shown in FIG. 8a. A photoresist pattern, not shown, is used as a mask to open contact hole, 18b, in silicon oxide layer, 17, and in silicon oxide layer 12, exposing the surface of heavily doped region, 11, in semiconductor substrate, 1. Contact hole, 18b, was formed using RIE procedures, with $CHF_3$ used as an etchant. Photoresist is then removed using plasma oxygen ashing and careful wet cleans. A fourth polysilicon layer, 20, is next deposited using LPCVD processing, at a temperature between about 480° to 620° C., to a thickness between about 500 to 1500 Angstroms, again using insitu doping via incorporation of either arsine or phosphine to the silane ambient. A photoresist mask, 21, is formed and used to define the polysilicon bottom capacitor electrodes, via RIE, using $Cl_2$ as an etchant. The bottom capacitor electrode lines the sides of contact hole 18b, for the DRAM device structure, shown schematically in FIG. 8a. For the SRAM device structure, shown schematically in FIG. 8b, the bottom capacitor electrode, formed from polysilicon layer, 20, overlies the polysilicon plug, 19, in contact holes, 18a. Another bottom capacitor electrode resides between polysilicon plug filled, contact holes, 18a, overlying planarized silicon oxide layer, 17. Photoresist mask, 21, is then removed using plasma oxygen ashing, followed by careful wet cleans.

Figure 9A:
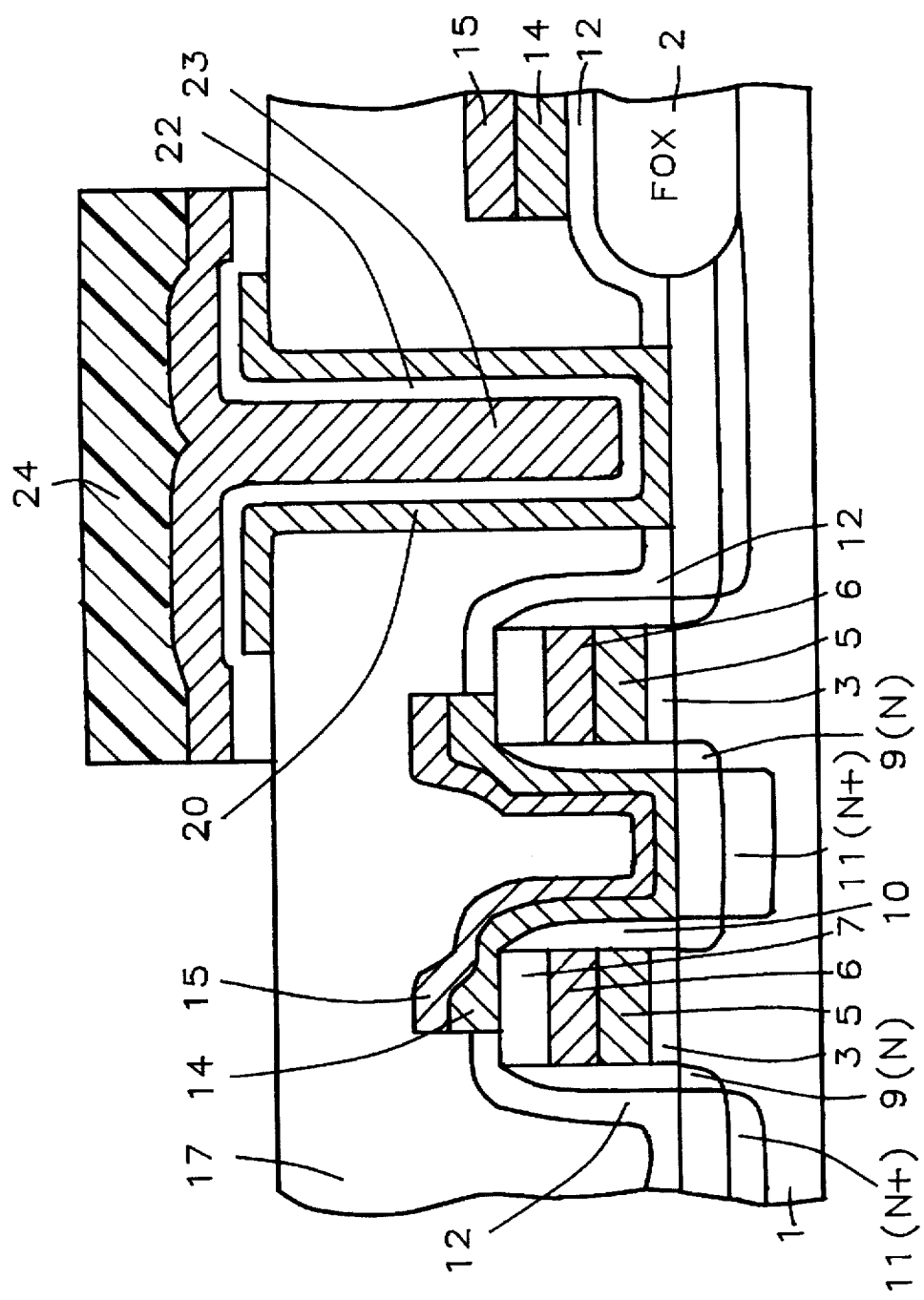
Figure 9B:
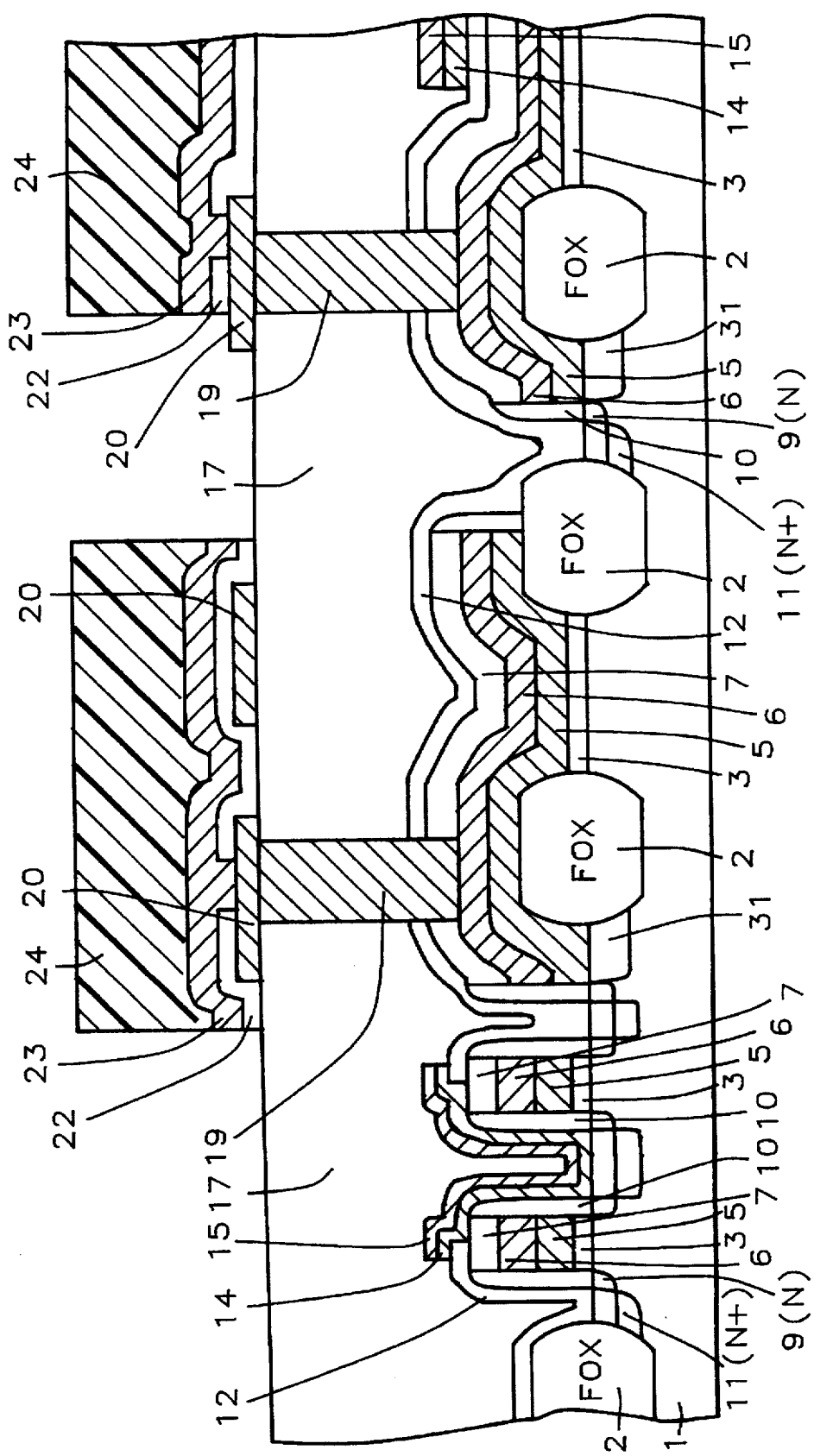

A capacitor dielectric layer, 22, is next addressed. A native silicon dioxide layer is formed, at a temperature between about 20° to 25° C., at a thickness between about 7 to 25 Angstroms, on the surface of the bottom capacitor electrode, created from polysilicon layer, 20. A thin layer of silicon nitride is then deposited, using LPCVD processes, at a temperature between about 650° to 850° C., to a thickness between about 40 to 100 Angstroms. A thermal oxidation is next performed at a temperature between about 700° to 900°, in an oxygen-steam ambient, to convert the silicon nitride layer to a silicon oxynitride layer. The thickness of this thin composite, capacitor dielectric layer, 22, shown schematically in FIGS. 9a, and 9b, is equivalent to between about 30 to 80 Angstroms, of silicon dioxide. The capacitor dielectric layer, 22, is next subjected to a photolithographic procedure, used to create a photoresist mask, (not shown), allowing RIE processing, using $CHF_3$ as an etchant, to remove capacitor dielectric layer, 22, in only regions of the capacitor dielectric layer, 22, that will be used for TFT portion of the SRAM device structure, exposing the top surface of bottom capacitor electrode, created from polysilicon layer, 21. This is schematically illustrated in FIG. 9b. After photoresist removal, using plasma oxygen ashing and careful wet cleans, a fifth polysilicon layer, 23, is deposited, using LPCVD processing, at a temperature between about 460° to 620° C., and to a thickness between about 300 to 2500 Angstroms. Polysilicon layer, 23, is doped either via the use of insitu doping procedures, or grown intrinsically and subjected to an ion implantation procedure, using arsenic or phosphorous, at an energy between about 25 to 80 KeV, at a dose between about 5E13 to 5E15 atoms/$cm^2$. The deposition of polysilicon layer, 23, completely fills contact hole, 18b, for the DRAM device structure, shown in FIG. 9a. A photoresist mask, 24, and RIE procedures, using Cl$_2$ as an etchant, are used to define the upper capacitor plate, created from polysilicon layer, 23, and shown schematically for the DRAM device structure, in FIGS. 9a, and for the TFT-SRAM device structure, in FIG. 9b. Also shown in FIG. 9b, is a region of out diffusion, 31, from polysilicon layer, 5, of the first polycide gate structure. This region had already been forming during previous process steps, and allows link up between the capacitor structure of the TFT-SRAM, and the access transistors of the SRAM, to occur. This is illustrated in FIG. 9b. Removal of photoresist mask, 24, is performed using plasma oxygen ashing and careful wet cleans.

Figure 10A:
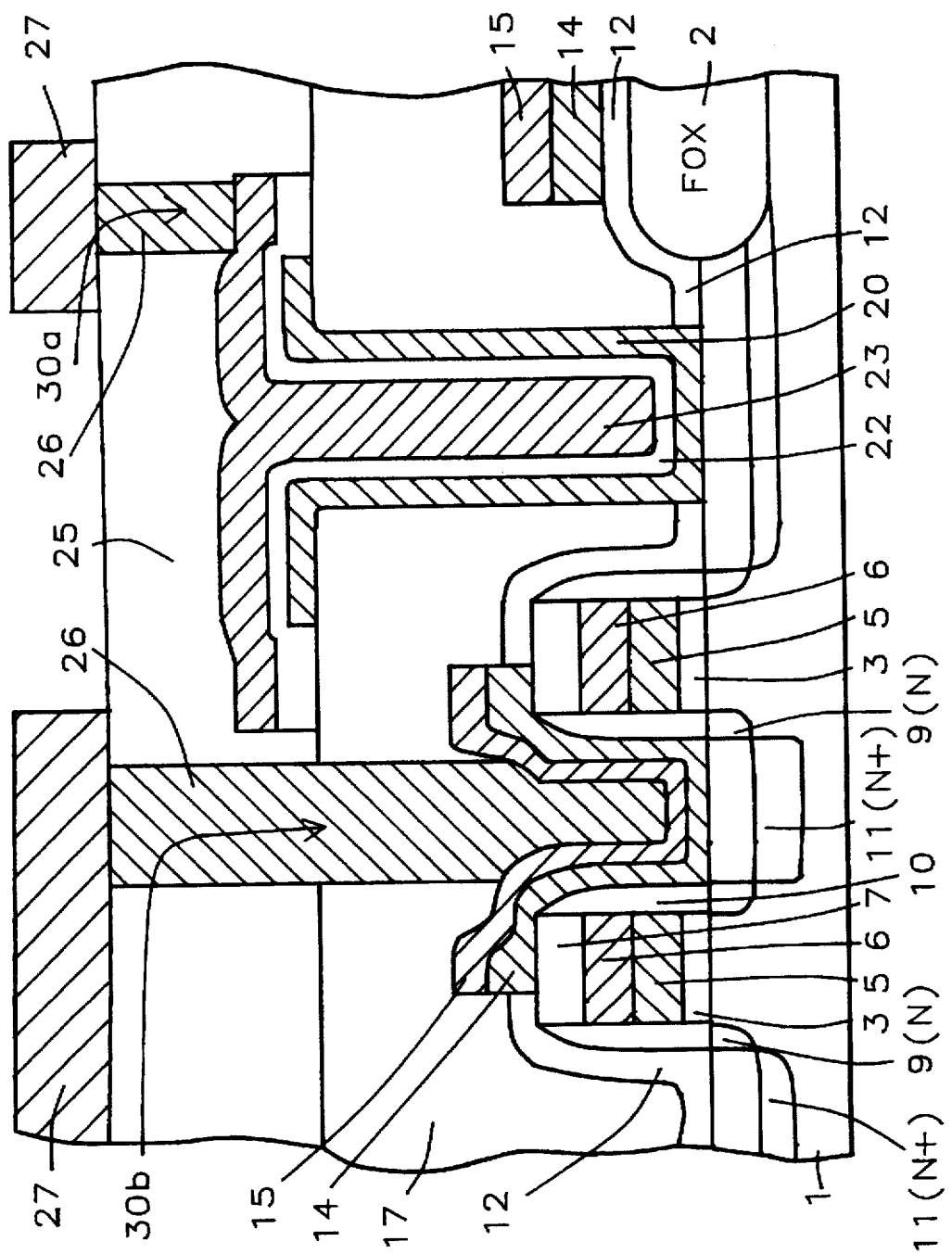
Figure 10B:
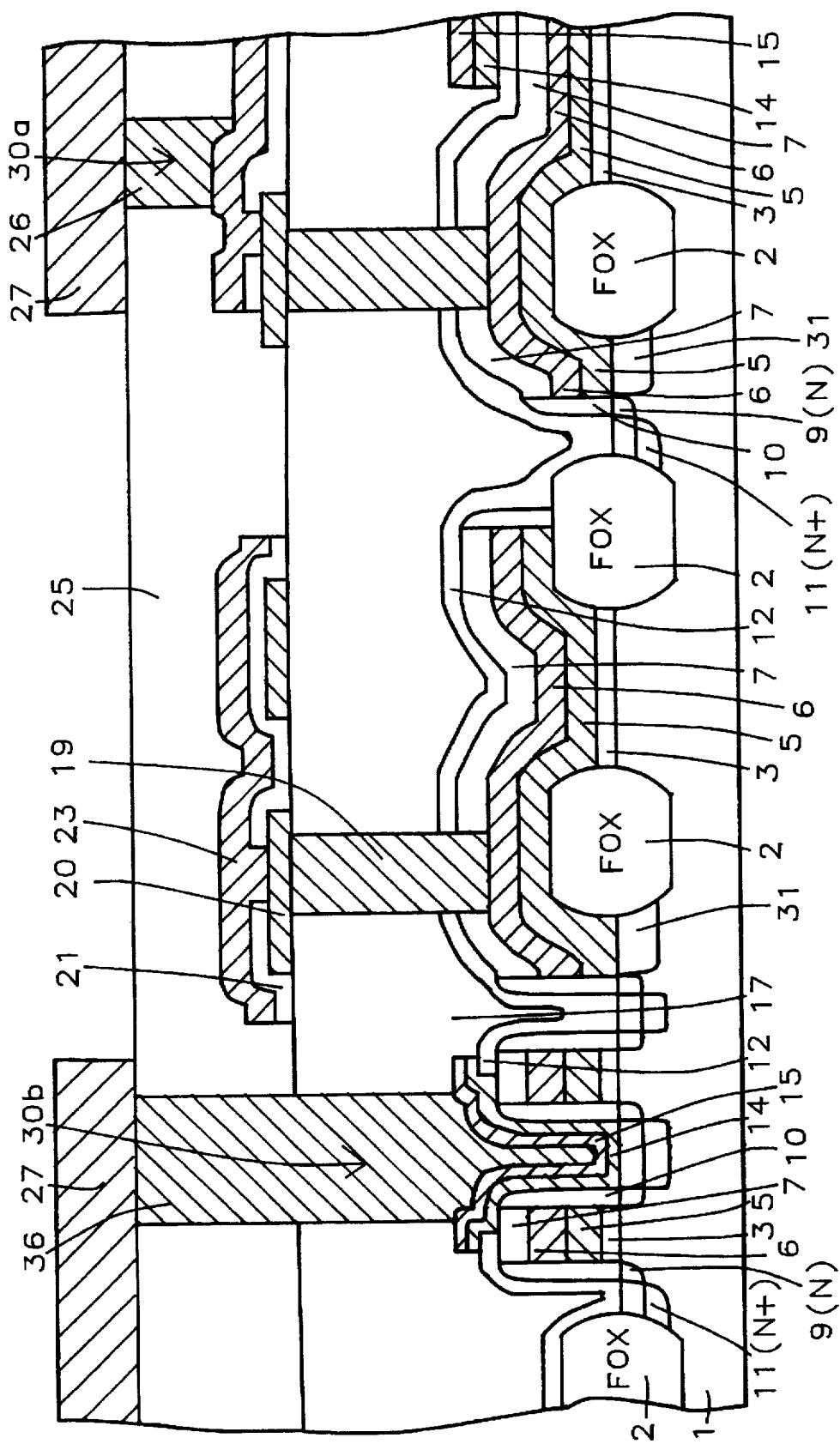

FIGS. 10a, and 10b, illustrate the deposition of a fifth insulator layer of silicon oxide, 25, using LPCVD or PECVD processes, at a temperature between about 400° to 800° C., to a thickness between about 4000 to 8000 Angstroms. Silicon oxide layer, 25, is planarized using chemical mechanical polishing procedures, resulting a planar topography. A photoresist pattern, (not shown), is used as a mask to create via holes, 30a, in silicon oxide layer, 25, and also to create via holes, 30b, in a composite layer of silicon oxide layer, 25, and silicon oxide layer, 17. The vias are created using RIE procedures, with CHF$_3$ used as the selective etchant. Via holes, 30a, between about 4000 to 8000 Angstroms in depth, expose the surface of the upper capacitor electrode, for the DRAM device structure, shown in FIG. 10a, while via hole 30a, exposes the upper capacitor electrode for the TFT-SRAM device structure, shown schematically in FIG. 10b. The deeper via holes, 30b, between about 9000 to 18000 Angstroms in depth, expose the transfer gate transistor of the DRAM device structure, shown in FIG. 10a, and the access transistor of the SRAM device structure shown in FIG. 10b. The use of the selective etchant CHF$_3$ allows the deeper via holes, 30b, to be etched, without attacking the upper capacitor electrodes, already exposed in via holes, 30a. Photoresist removal is accomplished using plasma oxygen ashing and careful wet cleans.

A deposition of tungsten is performed using LPCVD processing, at a temperature between about 420° to 500° C., to a thickness between about 4000 to 7000 Angstroms, using tungsten hexafluoride as a source, and completely filling via holes, 30a, as well as via holes, 30b. The unwanted regions of tungsten is removed from non-via hole regions, using either RIE, with Cl$_2$ used as the etchant, or by chemical mechanical polishing, in either case resulting in tungsten plugs, 26, embedded in via holes, 30a and via holes, 30b. This is schematically shown in FIG. 10a and FIG. 10b. A metal layer of aluminum, containing between about 0.5 to 3.0% copper, is deposited, using r.f. sputtering procedures, followed by photoresist patterning, (not shown), and RIE procedures, using Cl$_2$ as an etchant, producing metal contact structures, 27, for both DRAM and SRAM device structures, shown schematically in FIGS. 10a and 10b. Photoresist removal is once again accomplished via plasma oxygen ashing and careful wet cleans.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating memory and logic devices on a single semiconductor chip, comprising the steps of:

forming a field oxide in regions of semiconductor substrate to be used for said memory device, and in regions of said semiconductor substrate to be used for said logic device;

growing a silicon dioxide layer, to be used as a gate insulator, on surface of said semiconductor substrate, not covered by said field oxide;

removal of said gate insulator, in an area of said logic device, to be used to underlie a buried contact structure;

deposition of a first polysilicon layer;

doping of said first polysilicon layer;

deposition of a first metal silicide layer;

deposition of a first insulator layer;

patterning of said first insulator layer, of said first metal silicide layer, and of said first polysilicon layer, on said gate insulator, to create first polycide gate structures, to be used as transfer gate transistor structures for said memory device, and to create access transistor structures, for said logic device;

patterning of said first insulator layer, of said first metal silicide layer, and of said first polysilicon layer, on said gate insulator, and on said semiconductor substrate, to create said first polycide gate structure, to be used for buried contact structure, of said logic device;

ion implanting a first conductivity imparting dopant into regions of said semiconductor substrate being used for said memory device, that are not covered by said field oxide, or by said first polycide gate structures, to create lightly doped source and drain regions for said transfer gate transistor, and to provide a doped region for subsequent contact to a subsequent capacitor structure;

ion implanting a first conductivity imparting dopant into regions of said semiconductor substrate being used for said logic device, that are not covered by said field oxide, or by said first polycide gate structures, to create lightly doped source and drain region for said access transistors, and to create a doped region for link up to said buried contact structure;

depositing a second insulator layer;

anisotropic etching of said second insulator layer to form insulator sidewall spacers on sides of said first polycide gate structures;

ion implanting a second conductivity imparting dopant into regions of said semiconductor substrate being used for said memory device, that are not covered by said field oxide, not covered by said first polycide gate structures, and not covered by said insulator sidewall spacer, to create a heavily doped source and drain region for said transfer gate transistor, and to increase the doping level of said contact region, for the subsequent said capacitor structure;

ion implanting a second conductivity imparting dopant into regions of said semiconductor substrate being used for said logic device, that are not covered by said field oxide, not covered by said first polycide gate structures, and not covered by said insulator sidewall spacer, to create heavily doped source and drain region for said access transistors, and to increase said doped region, for subsequent link up to said buried contact structure;

depositing a third insulator layer;

patterning of said third insulator layer to expose said heavily doped source and drain regions in said semiconductor substrate, between said transfer gate transistors, of said memory device, and to expose said heavily doped source and drain regions in said semiconductor substrate, between access transistors, of said logic device;

deposition of a second polysilicon layer;

doping of said second polysilicon layer;

deposition of a second metal silicide layer;

patterning of said second metal silicide layer, and of said second polysilicon layer, to create a self aligned, second polycide gate structure, contacting underlying, said heavily doped source and drain region, in said semiconductor substrate, between said transfer gate transistors of said memory device;

patterning of said second metal silicide layer, and of said second polysilicon layer, to create a self aligned, second polycide gate structure, contacting underlying, said heavily doped source and drain region, in said semiconductor substrate, between said access transistors, of said logic device;

deposition of a fourth insulator layer;

planarization of said fourth insulator layer;

opening first contact holes in said fourth insulator layer, in said third insulator layer, and in said first insulator layer, to expose top surface of said first polycide gate structure, used for said buried contact structure, of said logic device;

deposition of a third polysilicon layer, completely filling said first contact holes, for said logic device;

doping of said third polysilicon layer;

removal of said third polysilicon from top surface of said fourth insulator layer, resulting in the formation of a polysilicon plug, in said first contact holes, contacting top surface of said first polycide gate structure, and used for said buried contact structure, of said logic device;

opening a second contact hole in said fourth insulator layer, and in said third insulator layer, to expose said doped region, in said semiconductor substrate, to be used for said contact region for a subsequent capacitor structure, for the said memory device;

deposition of a fourth polysilicon layer, including deposition on the sides of said second contact hole, for said memory device;

doping of said fourth polysilicon layer;

patterning of said fourth polysilicon layer to create bottom capacitor electrode, lining the sides of said second contact hole, for said memory device, and also creating said bottom capacitor electrode, contacting top surface of underlying, said polysilicon plug, in said first contact hole of said logic device;

growing an oxide on the top surface of said bottom capacitor electrode structures;

deposition of a silicon nitride layer;

thermal oxidation to convert said silicon nitride layer to a silicon oxynitride layer, forming a capacitor dielectric composite layer of oxynitride-oxide, (ONO);

opening a hole in said ONO layer, to expose top surface of said bottom capacitor electrode, which overlies said polysilicon plug, in said first contact hole, for said logic device;

deposition of a fifth polysilicon layer, completely filling said second contact hole, of said memory device, while contacting top surface of said bottom capacitor electrode, in opened hole in said capacitor dielectric composite layer, of SRAM device;

doping of said fifth polysilicon layer;

patterning of said fifth polysilicon layer, and of said capacitor dielectric composite layer, to form upper capacitor electrode, creating said capacitor structure, in said second contact hole, of said memory device, while creating a thin film transistor structure, on said buried contact structure, of said logic device;

deposition of a fifth insulator layer;

planarization of said fifth insulator layer;

opening via holes in said fifth insulator layer, and in said fourth insulator layer, to expose top surface of said second polycide gate structure, of said memory device, and exposing top surface of said second polycide gate structure, of said logic device;

opening said via holes in said fifth insulator layer, to expose top surface of said capacitor structure, of said memory device, and exposing top surface of said thin film transistor, on said buried contact structure, of said logic device;

deposition of a tungsten layer, completely filling said via holes;

removal of said tungsten layer from top surface of said fifth insulator layer, creating tungsten plugs in said via holes;

deposition of a metal layer; and patterning of said metal layer, to form metal contact structures, contacting top surface of underlying said, tungsten plugs, in said via holes.

2. The method of claim 1, wherein said gate insulator, is silicon dioxide, thermally grown in an oxygen-steam ambient, at a temperature between about 800° to 1000° C., to a thickness between about 60 to 200 Angstroms.

3. The method of claim 1, wherein said first polysilicon layer, is deposited using LPCVD processing, at a temperature between about 480° to 620° C., to a thickness between about 500 to 1500 Angstroms.

4. The method of claim 1, wherein said first metal silicide layer is tungsten silicide, deposited using LPCVD processing, at a temperature between about 420° to 600° C., to a thickness between about 1000 to 2000 Angstroms.

5. The method of claim 1, wherein said second conductivity imparting dopant, used to increase the doping level of said semiconductor substrate in regions needed for contact and link up, to subsequent structures used for memory and logic devices, is arsenic, ion implanted at an energy between about 35 to 100 KeV, at a dose between about 5E13 to 5E15 atoms/cm$^2$.

6. The method of claim 1, wherein said second polysilicon layer is deposited using LPCVD processing, at a temperature between about 480° to 620° C., to a thickness between about 500 to 1500 Angstroms.

7. The method of claim 1, wherein said second metal silicide layer is tungsten silicide, deposited using LPCVD processing, at a temperature between about 420° to 600° C., to a thickness between about 1000 to 2000 Angstroms.

8. The method of claim 1, wherein said third polysilicon layer, used to completely fill said first contact hole, is deposited using LPCVD processing, at a temperature between about 480° to 620° C., to a thickness about 5000 to 10000 Angstroms.

9. The method of claim 1, wherein said polysilicon plugs are formed in said first contact hole by removal of said third polysilicon layer, from top surface of said fourth insulator surface, via chemical mechanical polishing procedures.

10. The method of claim 1, wherein said polysilicon plugs are formed in said first contact hole by removal of said third polysilicon layer, from top surface of said fourth insulator layer, via RIE procedures, using $Cl_2$ as an etchant.

11. The method of claim 1, wherein said fourth polysilicon layer, used to from said bottom capacitor electrode, of said capacitor structure, is deposited using LPCVD processing, at a temperature between about 480° to 620° C., to a thickness between about 500 to 1500 Angstroms.

12. The method of claim 1, wherein said capacitor dielectric composite is silicon oxynitride-silicon dioxide, with an equivalent silicon dioxide thickness between about 30 to 80 Angstroms, and consisting of an underlying native silicon dioxide layer, at a thickness between about 7 to 25 Angstroms, and an overlying silicon oxynitride layer, formed by thermally oxidizing an LPCVD grown silicon nitride, in an oxygen-steam ambient, at a temperature between about 700° to 900° C.

13. The method of claim 1, wherein said fifth polysilicon layer, used to form said upper capacitor electrode, of said capacitor structure is deposited using LPCVD processing, at a temperature between about 460° to 620° C., to a thickness between about 300 to 2500 Angstroms.

14. A method for fabricating stacked capacitor DRAM devices, and thin film transistor SRAM devices on a single semiconductor chip, comprising the steps of:

forming a field oxide in regions of semiconductor substrate to be used for said DRAM device, and in regions of said semiconductor substrate to be used for said SRAM device;

growing a silicon dioxide, gate insulator, on surface of said semiconductor substrate, not covered by said field oxide;

removal of said silicon dioxide, gate insulator, from the surface of said semiconductor substrate, in a region to be used to underlie a subsequent buried contact structure, for said SRAM device;

deposition of a first polysilicon layer;

doping of said first polysilicon layer;

deposition of a first tungsten silicide layer;

deposition of a first insulator layer;

patterning of said first insulator layer, of said first tungsten silicide layer, and of said first polysilicon layer, on said silicon dioxide, gate insulator, to create a first polycide gate structure, to be used for transfer gate transistor structures, for said DRAM device, and to be used for access transistor structures, of said SRAM device;

patterning of said first insulator layer, of said first tungsten layer, and of said first polysilicon layer, on said silicon dioxide, gate insulator, and on region of said semiconductor substrate, to form said first polycide gate structure, to be used for said buried contact structure, of said SRAM device;

ion implanting a first conductivity imparting dopant into regions of said semiconductor substrate being used for said DRAM device, not covered by said field oxide, and not covered by said first polycide gate structures, to create a lightly doped source and drain region for said transfer gate transistors, and to provide a doped region for subsequent contact to a subsequent overlying capacitor structure;

ion implanting a first conductivity imparting dopant into regions of said semiconductor substrate being used for said SRAM device, not covered by said field oxide, and not covered by said first polycide gate structure, to create a lightly doped source and drain region for said access transistors, and to create a doped region for link up to said buried contact structure;

deposition of a second insulator layer;

anisotropic etching of said second insulator layer to form an insulator sidewall spacer on sides of said first polycide gate structures;

ion implanting a second conductivity imparting dopant into regions of said semiconductor substrate being used for said DRAM device, not covered by said field oxide, not covered by said first polycide gate structures, and not covered by said insulator sidewall spacers, to create a heavily doped source and drain region for said transfer gate transistors, and to increase the doping level of a region to be used for subsequent contact to a subsequent overlying capacitor structure;

ion implanting a second conductivity imparting dopant into regions of said semiconductor substrate being used for said SRAM device, not covered by said field oxide, not covered by said first polycide gate structures, and not covered by said insulator sidewall spacers, to create heavily doped source and drain region for said access transistors, and to increase the doping level of a region used for linkup to said buried contact structure;

deposition of a third insulator layer;

patterning of said third insulator layer to expose said heavily doped source and drain regions, between said transfer gate transistors, of said DRAM device, and to expose said heavily doped source and drain regions, between said access transistors, of said SRAM device;

deposition of a second polysilicon layer;

doping of said second polysilicon layer;

deposition of a second tungsten silicide layer;

patterning of said second tungsten silicide layer, and of said second polysilicon layer, to create a second polycide gate structure, contacting, and self aligned, to said heavily doped source and drain region, between said transfer gate transistors of said DRAM device;

patterning of said second tungsten silicide layer, and of said second polysilicon layer, to create said second polycide gate structure, contacting, and self aligned, to said heavily doped source and drain region, between said access transistors of said SRAM device;

deposition of a fourth insulator layer;

planarization of said fourth insulator layer;

opening a first contact hole in said fourth insulator layer, in said third insulator layer, and in said first insulator layer, to expose top surface of said first polycide gate structure, used for said buried contact structure of said SRAM device;

deposition of a third polysilicon layer, completely filling said first contact hole, and contacting top surface of said first polycide gate structure, used for said buried gate structure of SRAM device;

doping of said third polysilicon layer;

removal of said third polysilicon layer from top surface of said fourth insulator layer, resulting in the formation of a polysilicon plug, in said first contact hole, for said SRAM device;

opening a second contact hole in said fourth insulator layer, and in said third insulator layer, to expose a heavily doped region, in said semiconductor substrate, to be used for said contact region for a subsequent capacitor structure, for the DRAM device;

deposition of a fourth polysilicon layer;

doping of said fourth polysilicon layer;

patterning of said fourth polysilicon layer to create bottom capacitor electrode, lining the sides of said second contact hole, of said DRAM device, and also creating said bottom capacitor electrode, contacting top surface of underlying, said polysilicon plugs, in said first contact hole of said SRAM device;

growing an oxide on top surface of said bottom capacitor electrodes;

deposition of a silicon nitride layer;

thermal oxidation to convert top surface of said silicon nitride layer to a oxynitride layer, and forming a capacitor dielectric composite layer of oxynitride-oxide, (ONO);

opening a hole in said capacitor dielectric layer, to expose top surface of said bottom capacitor electrode, which overlies said polysilicon plug, in said first contact hole of said SRAM device;

deposition of a fifth polysilicon layer, completely filling said second contact hole, of said DRAM device, while contacting top surface of said bottom capacitor electrode, in region of opened hole in said capacitor dielectric composite layer, in said SRAM device;

doping of said fifth polysilicon layer;

patterning of said fifth polysilicon layer, and of said capacitor dielectric composite layer, to form upper capacitor electrode, creating capacitor structure, in said second contact hole of said DRAM device, while creating a thin film transistor structure, on said buried contact structure of said SRAM device;

deposition of a fifth insulator layer;

planarization of said fifth insulator layer;

opening via holes in said fifth insulator layer, and in said fourth insulator layer, to expose top surface of said second polycide gate structures of said DRAM device, and to expose top surface of said second polycide gate structure of said SRAM device;

opening said via holes in said fifth insulator layer, to expose top surface of said capacitor structure, in said second contact hole, of said DRAM device, and exposing top surface of said thin film transistor structure, on said buried contact structure of said SRAM device;

deposition of a tungsten layer, completely filling said via holes;

removal of said tungsten layer from top surface of said fifth insulator layer, creating tungsten plugs in said via holes;

deposition of a metal layer; and patterning of said metal layer to form metal contact structures, contacting top surface of underlying, said tungsten plugs, in said via holes.

15. The method of claim 14, wherein said silicon dioxide, gate insulator is thermally grown at a temperature between about 800° to 1000° C., to a thickness between about 60 to 200 Angstroms, in an oxygen-steam ambient.

16. The method of claim 14, wherein said first polysilicon layer is deposited using LPCVD processing, at a temperature between about 480° to 620° C., to a thickness between about 500 to 1500 Angstroms.

17. The method of claim 14, wherein said first tungsten silicide layer is deposited using LPCVD processing, at a temperature between about 420° to 600° C., to a thickness between about 1000 to 2000 Angstroms.

18. The method of claim 14, wherein said second conductivity imparting dopant, used to increase the doping level of said semiconductor substrate in regions designed for contact to said capacitor structure, of said DRAM device; and in regions designed for link up to said buried contact structure, of said SRAM device, is arsenic, ion implanted at an energy between about 35 to 100 KeV, at a dose between about 5E13 to 5E15 atoms/cm$^2$.

19. The method of claim 14, wherein said second polysilicon layer is deposited using LPCVD processing, at a temperature between about 480° to 620° C., to a thickness between about 500 to 1500 Angstroms.

20. The method of claim 14, wherein said second tungsten silicide layer is deposited using LPCVD processing, at a temperature between about 420° to 600° C., to a thickness between about 1000 to 2000 Angstroms.

21. The method of claim 14, wherein said third polysilicon layer, used to completely fill said first contact hole, of said SRAM device, is deposited using LPCVD processing, at a temperature between about 480° to 620° C., to a thickness between about 5000 to 1000 Angstroms.

22. The method of claim 14, wherein said polysilicon plugs are formed in said first contact hole, of said SRAM device, by removal of said third polysilicon layer, from top surface of said fourth insulator layer, via chemical mechanical polishing procedures.

23. The method of claim 14, wherein said polysilicon plugs are formed in said first contact hole, of said SRAM device, by removal of said third polysilicon layer, from top surface of said fourth insulator layer, via RIE procedures, using $Cl_2$ as an etchant.

24. The method of claim 14, wherein said fourth polysilicon layer, used to form said bottom capacitor electrode, of DRAM capacitor structure, and used to form said bottom capacitor electrode of said SRAM thin film transistor structure, is deposited using LPCVD processing, at a temperature between about 480° to 620° C., to a thickness between about 500 to 1500 Angstroms.

25. The method of claim 14, wherein said capacitor dielectric composite layer is silicon oxynitride-silicon dioxide, with an equivalent silicon dioxide thickness between about 30 to 80 Angstroms, consisting of an underlying native silicon dioxide layer, at a thickness between about 7 to 25 Angstroms, and an overlying layer of silicon oxynitride, at a thickness between about 10 to 40 Angstroms, formed by thermally oxidizing an LPCVD grown silicon nitride layer.

26. The method of claim 14, wherein said fifth polysilicon layer, used to completely fill said second contact hole, and form said upper capacitor electrode for said DRAM capacitor structure, and used to form said thin film transistor structure, on said SRAM buried contact structure, is deposited using LPCVD processing, at a temperature between about 460° to 620° C., to a thickness between about 300 to 2500 Angstroms.

* * * * *